United States Patent [19]

Masuda

[11] Patent Number: 5,710,384
[45] Date of Patent: Jan. 20, 1998

[54] MAGNETO-OPTICAL RECORDING MEDIUM TARGET AND MANUFACTURE METHOD OF SAME

[75] Inventor: Kaoru Masuda, Yasugi, Japan

[73] Assignee: Hitachi Metals, Ltd., Tokyo, Japan

[21] Appl. No.: 613,096

[22] Filed: Mar. 8, 1996

[30] Foreign Application Priority Data

Mar. 8, 1995 [JP] Japan .................. 7-077243

[51] Int. Cl.$^6$ .................. C22C 19/00; B22F 3/00
[52] U.S. Cl. .................. 75/246; 419/30; 419/39; 419/48
[58] Field of Search .................. 75/246; 419/48, 419/39, 30

[56] References Cited

U.S. PATENT DOCUMENTS

| | | | |
|---|---|---|---|
| 4,620,872 | 11/1986 | Hijikata et al. | 75/246 |
| 4,824,481 | 4/1989 | Chatterjee et al. | 75/246 |
| 4,957,549 | 9/1990 | Matsumoto et al. | 75/246 |
| 5,062,885 | 11/1991 | Matsumoto et al. | 75/255 |
| 5,098,649 | 3/1992 | Matsumoto et al. | 419/48 |

FOREIGN PATENT DOCUMENTS

| | | | |
|---|---|---|---|
| 61-91336 | 5/1986 | Japan | C22C 1/02 |
| 61-139637 | 6/1986 | Japan | C22C 30/00 |
| 63-45366 | 2/1988 | Japan | C23C 14/34 |
| 64-25977 | 1/1989 | Japan | C23C 14/34 |

*Primary Examiner*—Ngoclan Mai
*Attorney, Agent, or Firm*—Sughrue, Mion, Zinn, Macpeak & Seas, PLLC

[57] ABSTRACT

The invention provides a magneto-optical recording medium target and a manufacture method thereof which target can produce the leakage magnetic flux in sufficient density and has the high mechanical strength. The target is a sintered body containing 15 to 30 atomic % at least one rare earth metal and the balance at least one transition metal, in which alloy powder having such a composition is sintered so that the original morphology of the alloy powder essentially remains. Specifically, the target has a micro structure in which the alloy powder particles consisted of the rare earth metal and the transition metal are interconnected through grain boundary phases. The target is able to have the deflective strength not less than 50 MPa, the relative density not less than 99%, and the content of oxygen not more than 1000 ppm. Particulate micro structures preferably have a grain size $d \leq 250$ μm and a volume mean size $d_{av}$ of $50 \leq d_{ad} \leq 120$ μm. The target can be manufactured by producing alloy powder having the above target composition and sintering the alloy powder at a temperature lower than the liquid phase occurring temperature by 30° C. or more and under a high pressure not less than 90 MPa.

9 Claims, 1 Drawing Sheet

(×50)
200μm (×100)
100μm (×50)
200μm (×50)
200μm

MAGNETO-OPTICAL RECORDING MEDIUM TARGET AND MANUFACTURE METHOD OF SAME

FIELD OF THE INVENTION

The present invention relates to a sputtering target for use in manufacture of magneto-optical recording media and a manufacture method of the target.

DESCRIPTION OF THE RELATED ART

Heretofore, alloy thin films of rare earth metals and transition metals, for use as magneto-optical recording media, have been manufactured by the sputtering process in which a thin film is formed by sputtering of a target.

As disclosed in Japanese Patent Laid-Open No. 63-45366, for example, such a sputtering target can be manufactured by the melting and casting process under an argon atmosphere using an induction heating furnace. The melting and casting process is advantageous in that the content of oxygen is low and used targets can be easily recycled.

On the other hand, targets manufactured by the melting and casting process have the problems that the crystal grain size is large because the target has a cased micro structure, and the micro structure tends to be uniform because the target is susceptible to segregation. Another problem is that because the composition providing magneto-optical recording characteristics essentially corresponds to the composition in the form of an intermetallic compound, the targets manufactured by the melting and casting process are brittle and easy to crack.

Recently, to reduce ununiformity of the micro structure caused by segregation, a manufacture process utilizing powder sintering has been proposed. Japanese Patent Laid-Open No. 61-91336, for example, discloses a manufacture method with which a uniform micro structure free from segregation is obtained by pulverizing an alloy ingot produced by arc melting and then sintering resultant alloy powder by hot-pressing.

Further, Japanese Patent Laid-Open No. 61-139637 discloses a manufacture method with which rapid cooled alloy powder is sintered in vacuum or an inert gas atmosphere so that the crystal grain size of the target micro structure is restricted to 20 µm or less. This method can reduce the oxygen content of a sintered body and lessen brittleness as compared with the above manufacture method of pulverizing an ingot to produce alloy powder.

The above-cited Japanese Patent Laid-Open No. 61-139637 also proposes to eliminate unevenness of the composition by restricting the crystal grain size of the target micro structure to 20 µm or less. The targets manufactured by those methods are called prealloy targets because of using a material alloy which has been alloyed in advance.

The manufacture method of using rapid cooled alloy powder as materials to reduce the oxygen content of the target, as described in the above-cited Japanese Patent Laid-Open No. 61-139637, is effective in improving brittleness of the target. At the present, however, there is a demand for a further improvement in the mechanical strength.

In these situations, Japanese Patent Laid-Open No. 61-119648 proposes a target wherein a simple (, that is, a simple substance) of rare earth metal and transition metal are joined together by diffusion phase, as one approach for increasing the mechanical strength.

Also, Japanese Patent Laid-Open No. 1-25977 proposes a target of the micro structure in which rapid cooled powder of rare earth metal and iron group metal is joined together with powder of iron group metal.

These targets are called composite targets and have the improved mechanical strength.

In the field of sputtering, a magnetron sputtering apparatus has been recently employed in which a magnetic field is generated on the target surface to enclose plasma during the sputtering for increasing the sputtering speed.

This magnetron sputtering apparatus requires that the target surface is provided with the leakage magnetic flux in sufficient density.

However, the above-mentioned composite targets have the problem that the leakage magnetic flux is difficult to generate because the iron group metal showing ferromagnetism is basically remained in the micro structure of the "composite target".

On the other hand, the prealloy targets disclosed in the above-cited Japanese Patent Laid-Open No. 61-139637, etc. have small permeability due to the alloying and are more advantageous in application to magnetron sputtering than the composite targets.

Particularly, for targets utilizing expensive rare earth metals, it is required to employ one target with maximum possible efficiency and, therefore, a difficulty in producing the leakage magnetic flux is a vital problem. For this reason, an attention is now going to focus on the prealloy targets again instead of the composite targets.

Such a trend raises a pressing need for solving the problem of the prealloy targets, i.e., for a further improvement in the mechanical strength thereof.

SUMMARY OF THE INVENTION

In view of the problems as set forth above, an object of the present invention to provide a magneto-optical recording medium target which can produce the leakage magnetic flux in sufficient density and has the high mechanical strength, as well as a manufacture method of the target.

The inventors have studied in detail the method of further increasing the mechanical strength of the above-stated prealloy targets in relation to the target micro structure. Then, the present invention has been accomplished based on the finding that, instead of producing the target with a uniform micro structure, by utilizing the powder metallurgical process and by sintering prealloyed raw material powder composed essentially of an intermetallic compound under a condition where the original morphology of the raw material powder essentially remains, the mechanical strength can be more increased than in the uniform micro structure.

Thus, the present invention provides a magneto-optical recording medium target wherein alloy powder containing of 15 to 30 atomic % of at least one rare earth metal and the balance of at least one transition metal is sintered to provide a target micro structure in which the original morphology of the raw alloy powder essentially remains. Specifically, the target is a sintered such that traces of the particle surfaces of alloy material powder having the above composition remains in the micro structure.

More specifically, the present invention provides a magneto-optical recording medium target wherein particulate micro structures in which the original morphology of alloy powder having a composition of 15 to 30 atomic % of at least one rare earth metal and the balance of at least one transition metal remains are interconnected through grain boundary phases to provide a target structure, and the deflective strength of the target is not less than 50 MPa.

Preferably, in a microstructure of the target, the particulate micro structures interconnected through the grain boundary phases between the alloy powder substantially has a grain size d≦350 μm. More specifically, the grain size d of the particulate micro structures is in the range of d≦250 μm and the volume mean size $d_{av}$ of the particulate micro structures is in the range of $50 \leq d_{ad} \leq 120$ μm.

Also preferably, the target has density not less than 99% in relative density, the content of oxygen not more than 1000 ppm, and the deflective strength not less than 70 MPa.

The above-mentioned target can be manufactured by a manufacture method of the present invention comprising the steps of producing prealloyed material powder having a target composition of 15 to 30 atomic % of at least one rare earth metal and the balance of at least one transition metal in advance, and then sintering the prealloyed material powder at a temperature lower than the liquid phase occurring temperature of the target composition by 30° C. or more and under a high pressure not less than 90 MPa.

DETAILED DESCRIPTION OF THE PREFERRED EMBODIMENTS

From a microstructure point of view, the most important feature of the target of the present invention resides in that particulate micro structures formed of units each having a size equal to the size of the particles of the alloy powder used are interconnected through grain boundary phases to thereby form a target micro structure.

In the prior art method of manufacturing a target from a prealloy, when sintering of alloy powder having the composition of an intermetallic compound is progressed, the micro structure becomes uniform through diffusion at the interface of the alloy powder.

Figure 2:
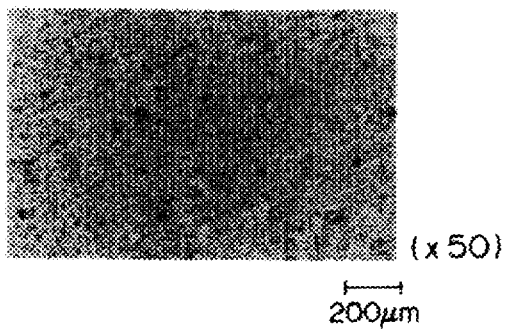
FIG. 2 is a photograph showing a metallic sintered microstructure of a target of one comparative example.

Eventually, the original morphology of the material powder disappears and the grain boundaries are vanished. A typical microstructure of the prior art of such type is shown in FIG. 2. The resulting micro structure comes to be closer to such a condition as the whole target is made of one intermetallic compound, i.e. to the micro structure of a target manufactured by the melting and casting process. This means that the target has brittleness inherent to the intermetallic compound.

In the present invention, therefore, the sintering of the material powder is not made to progressed till reaching the uniform micro structure, but is made to stop the diffusion occurring during the sintering so that the material powder which is to become the particulate micro structure is interconnected through the grain boundary phases generated among particles of the alloy powder.

Figure 1A:
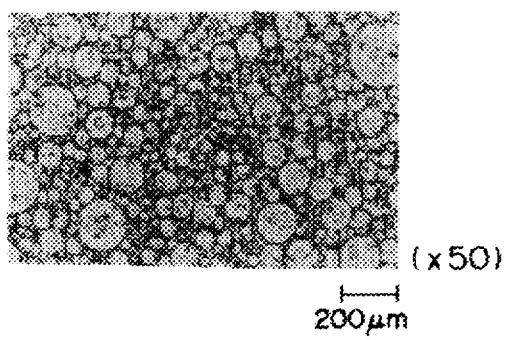
FIGS. 1a and 1b are photographs showing a metallic sintered microstructure of a target of the present invention.
Figure 1B:
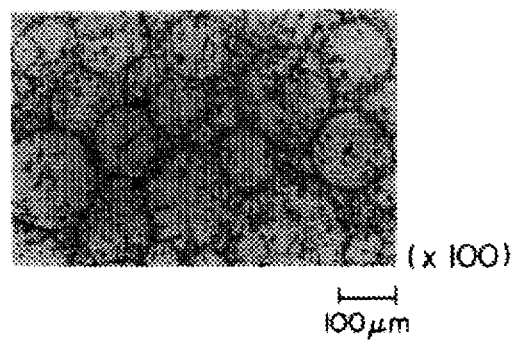

Observing a microstructure of the target of the present invention, as typically shown in FIG. 1, most of the original surface morphology of the material powder remains, that is to say, traces of the particle surfaces of the alloy material powder remain. Note that FIG. 1 is a photograph taken by etching the target with a nital etching reagent and observing a microstructure at the magnification of 50 and 100. As a result of sintering the material powder under pressure in accordance with the manufacture method of the present invention, although some particles of the powder are slightly deformed at the outermost thereof and although some diffusion portions occur depending on the pressure, the original morphology and size of the individual particles can be clearly observed even from the microstructure photograph of the target of the present invention taken at the magnification of 50. The expression that the alloy powder is sintered to provide a target micro structure in which the original morphology of the alloy powder "substantially" remains means such a state.

The presence of those particulate micro structures is confirmed by the above-mentioned etching. In the regions between the particulate micro structures which are essentially of intermetallic compounds, there are formed inter-powder grain boundary phases which have generated from the raw material alloy powder and in which etching is easy to advance. With the presence of the grain boundary phases, the regions for damping heat stress, etc. during the period of sputtering the target are formed and hence the target can be prevented from cracking, chipping-off or so during the sputtering period.

Further, since the formation of the grain boundary phases increases the mechanical strength of the target itself as compared with the target having the uniform micro structure, it is possible to facilitate not only working of a sintered body into the target body, but also handling of the sintered body.

In the present invention, the particulate micro structure (i.e., the alloy powder) making the target have a composition of 15 to 30 atomic % of at least one rare earth metal and the balance of at least one transition metal.

This composition range corresponds to a range by which practical characteristics (coercive force, Kerr rotation angle, and Curie temperature) suitable for magneto-optical recording media can be obtained.

Within the above composition range, there is formed an intermetallic compound of rare earth metal and transition metal which compound has low permeability. As the particulate micro structures of these intermetallic compounds having low permeability are interconnected through joining interfaces to thereby form the target of the present invention, the target itself can also have low permeability.

In the target of the present invention, the particulate micro structures observed in a microstructure preferably have a grain size d≦350 μm, more preferably ≦250 μm, and a volume mean size $d_{av}$ preferably in the range of $50 \leq d_{ad} \leq 120$ μm. The reason of setting an upper limit of the grain size of the particulate micro structures to 350 μm, more preferably 250 μm, is that if the particulate micro structures are too large, the amount of the joining interfaces would be so reduced as to lower the deflective strength and easily cause cracking. Additionally, since voids between the particles can not be fully filled if only alloy powder having the same grain size is employed, it is preferable to use the alloy powder having the grain size distributed.

The reason of setting the volume mean size $d_{av}$ to the range of $50 \leq d_{ad} \leq 120$ μm is as follows. The material powder must be prepared so as to obtain fine particulate micro structures. However, if the material powder becomes too fine, the powder would tend to contain oxygen in a larger amount and the excessive content of oxygen would result in a risk of making the target brittle.

Further, if the grain size is too small, the diffusion is apt be so progressed in the densifying process that it becomes hard to keep the particulate micro structures, resulting in the reduced mechanical strength.

Incidentally, the term "volume mean size" defines a mean size of particles based on the following formula:

$$d_{ad} = (\Sigma n d_p^3 / \Sigma n)^{1/3}$$

where n: number of the particles, and $d_p$: grain size of each particle.

The material powder prepared and used in manufacturing the target of the present invention is also responsible for ensuring that the original morphology of the material powder essentially remains to provide the particulate micro structures. Thus, in order that the particulate micro structures making the target of the present invention has the grain size in the foregoing range, it is also required to limit the grain size of the material powder similarly.

Under the limitations described above, the target having density not less than 99% in relative density, the content of oxygen not more than 1000 ppm, and the deflective strength not less than 70 MPa can be achieved.

In the manufacture method of the present invention, to obtain the particulate micro structures meeting the above requirements, material powder having a target composition of 15 to 30 atomic % of at least one rare earth metal and the balance of at least one transition metal is produced as a prealloy in advance.

Then, the material powder is sintered at a temperature lower than the liquid phase occurring temperature of the target composition by 30° C. or more and under a high pressure not less than 90 MPa. As a result, when observing a microstructure of the manufactured target, there is formed a target micro structure where the particulate micro structures are interconnected through the grain boundary phases generated among the particles of the alloy powder.

Here, the important respect is relation between pressure, temperature and composition. The liquid phase occurring temperature varies to a large extent depending on the composition. If the sintering temperature is close to the liquid phase occurring temperature, solid phase diffusion would occur quickly to develop uniform micro structures which do not have any joining interfaces with the result that the mechanical strength of the target is reduced.

Also, if the pressure is too low, the sintering can not be progressed, thereby leaving many voids. The presence of these voids also prevents the target from exhibiting a sufficient degree of density and mechanical strength.

In the present invention, it is required to carry out the sintering under the conditions meeting the temperature and the pressure stated above, and to cease the sintering at the state where the joining interfaces still exist.

If the sintering temperature is too low, compaction of the sintered body will be insufficient. Therefore, the sintering is preferably performed at a temperature lower than the liquid phase occurring temperature of the target composition by 30° to 100° C.

For the purpose of reducing the oxygen content, the material powder of the present invention is preferably produced by the quenching solidification process such as gas atomization and centrifugal quenching, rather than comminution.

Since the sintering of the material powder requires high pressure (within the above-explained temperature range), it is practically preferable to sinter the material powder by using a HIP (hot isostatic press). The HIP process can easily manufacture a sintered body having high density not less than 99% in relative density on an assumption that the density of a cast ingot is 100%.

When using an ordinary hot press, because it has an upper limit of the load at about 10 to 20 MPa, a difficulty is raised in sufficiently compacting the material powder to high density near the true density. Also, while the hot press performs uniaxial compression, the HIP performs isotropic compression, which is advantageous in making the sintered body free from anisotropy and improving the mechanical strength.

The HIP process capable of performing the isotropic compression is also effective in maintaining the original morphology of the material powder and securing the joining interfaces. The uniaxial compression by the hot press is disadvantageous in that the sintering of the material powder is progressed in the direction of compression. Therefore, if the density is attempted to increase, the diffusion in the direction of compression would be so far advanced that the grain boundary phases effective to ensure the mechanical strength will be disappeared and the mechanical strength will become insufficient.

In the target of the present invention, as the transition metal for achieving the desired magneto-optical characteristics, iron group elements such as Fe, Co and Ni are preferably selected alone or in combination.

As the rare earth metal for achieving the desired magneto-optical characteristics, Nd, Gd, Tb, Dy, Ho, Ev and Tm can be employed alone or in combination.

Further, as elements to improve corrosion resistance is also required for thin films of magneto-optical recording media in addition the basic magneto-optical characteristics, one or more selected from among Ti, Al, V, Nb, Ta, Cr, Mo, W, Pd and Pt can be added in an amount not more than 15 atomic %. Specifically, for the composition of 20 to 30% Tb, 60 to 80% Fe and not more than 10% Co, it's preferable, for example, that 1 to 4% Cr or 0.5 to 3% Nb be added alone or in combination.

However, since those elements to improve corrosion resistance are not desired for the magneto-optical characteristics, they are added in an amount as small as possible depending on the corrosion resistance required. Those elements may be added in the simple or alloyed form.

EXAMPLE 1

A rare earth-transition metal alloy ingot having a composition of, by atomic, 26% Tb, 68% Fe and 6% Co was produced by a vacuum high-frequency melting furnace. The charged weight was 12 kg, the vacuum degree was $6 \times 10^{-3}$, and the ingot was cast in vacuum after the melting.

The cast ingot was put in an atomizer provided with a molten metal-dropping nozzle at the bottom of a crucible, and then pulverized by an argon gas atomization. The grain size of resulting material powder was adjusted by screening.

The minimum grain size $d_{min}$, the maximum grain size $d_{max}$, and the volume mean size $d_{av}$ were measured by using a grain size meter of sedimentary type.

The produced powder was a ternary alloy whose exact liquid phase occurring temperature was not clear. But the liquid phase occurring temperature of the powder was determined as 1187° C. from the binary phase diagram of Fe and Tb which Fe is a main element of the iron group.

Next, the powder was enclosed in a capsule made of soft steel and then sintered by a hot isostatic press (HIP), thereby obtaining a target blank. The HIP conditions were temperature of 1140° C., pressure of 100 MPa and holding time of 2 hours.

The surface of the resulting target blank was etched by using an ethylalcohol solution containing 5% nitric acid (i.e., a nital etching reagent), and its microstructure was observed at the magnification of 50 or 100. Then, based on the intercept method, the volume mean size of particles was determined from the extracted particles and the volume mean size of particulate micro structures was determined. Further, the deflective strength was measured as estimating the mechanical strength, followed by measurements of the oxygen content, density and specific permeability.

As comparative examples, Sample No. 2 was manufactured at the higher HIP temperature, and Sample No. 3 was a target having the same composition but manufactured by the melting and casting process. These targets were also subjected to the similar measurements.

Results of the measurements are shown together in Tables 1 and 2. Incidentally, the density is relative density on assumption that the density of the cast ingot produced before gas atomization is 100%.

TABLE 1

| No. | MATERIAL POWDER GRAIN SIZE (μm) | | | HIP TEMPERATURE | REMARKS |
|---|---|---|---|---|---|
| | dmin | dmax | dav | (°C.) | |
| 1. | 18 | 238 | 113 | 1140 | INVENTIVE EXAMPLE |
| 2. | 18 | 238 | 113 | 1170 | COMPARATIVE EXAMPLE |
| 3. | CAST TARGET | | | — | |

Figure 3:
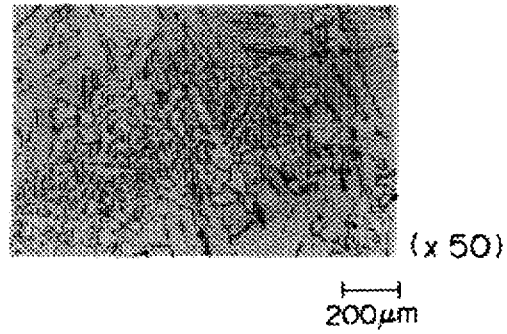
FIG. 3 is a photograph showing a metallic microstructure of a target of another comparative example manufactured by the melting and casting process.

From comparison of FIGS. 1 to 3, it is seen that in FIG. 1 indicating Sample No. 1 of the present invention, the original morphology of the sintered material powder is essentially maintained to form particulate micro structures, and these particulate micro structures are interconnected through grain boundary phases between the alloy particles to make the target micro structure.

By contrast, in the target of Sample No. 2 manufactured at the higher HIP temperature shown in FIG. 2, the boundary between particulate micro structures cannot be found even after the etching. It is also seen that the target having such a micro structure has the lower deflective strength than the target of Sample No. 1 of the present invention.

On the other hand, it is seen that the cast target of Sample No. 3 representing one prior art has the low content of oxygen, but the cast micro structure includes undesired segregation as shown in FIG. 3. It is also seen that the deflective strength of Sample No. 3 is much lower than the target of Sample No. 1 of the present invention.

Further, from the measurement results of specific permeability, it is seen that the target of Sample No. 1 of the present invention has low specific permeability and high deflective strength and is hence more suitable for magnetron sputtering.

EXAMPLE 2

Different types of material powder having compositions and grain sizes shown in Table 3 below were produced in the same manner as in Example 1. The liquid phase occurring temperatures shown in Table 3 were each determined from the binary phase diagram, assuming that one of the rare earth metals Gd, Tb and Dy which has the maximum content includes the total content of the rare earth metals and the balance Fe.

The produced powder was enclosed in a capsule made of soft steel and then sintered by a hot isostatic press (HIP), thereby obtaining a target blank. The HIP conditions were pressure of 100 MPa, holding time of 2 hours, and temperatures as shown in Table 3.

After etching the surface of each resulting target blank was etched by using an ethylalcohol solution containing 5% nitric acid, based on the intercept method, the volume mean size of particles was determined from the extracted particles and the volume mean size of particulate micro structures was determined. Further, the deflective strength was measured as estimating the mechanical strength, followed by measurements of the oxygen content, density and specific

TABLE 2

| | TARGET | | | | | | |
|---|---|---|---|---|---|---|---|
| | MICRO STRUCTURE GRAIN SIZE (μm) | | | DEFLECTIVE STRENGTH | OXYGEN CONTENT | DENSITY | SPECIFIC PERMEABILITY | REMARKS |
| No. | dmin | dmax | dav | (MPa) | (ppm) | (%) | | |
| 1. | 20 | 230 | 118 | 94 | 482 | >99.5 | 2 | INVENTIVE EXAMPLE |
| 2. | — | — | — | 48 | 476 | >99.5 | 2 | COMPARISON EXAMPLE |
| 3. | CAST TARGET | | | 8 | 48 | 100 | 3 | |

FIGS. 1, 2 and 3 are photographs of the microstructures taken by etching all Samples Nos. 1 to 3 and observing the etched surfaces.

permeability. Note that, for Sample No. 9 using fine particles as material, the HIP temperature was a little lowered (1100° C.).

Results of the measurements are shown together in Table 4. Incidentally, the density is relative density on assumption that the density of the cast ingot is 100%.

TABLE 3

| | MATERIAL POWDER | | | | | | | | LIQUID PHASE DEVELOPING TEMPERATURE | HIP TEMPERATURE |
|---|---|---|---|---|---|---|---|---|---|---|
| | COMPOSITION (ATOMIC %) | | | | | GRAIN SIZE (μm) | | | | |
| No. | Gd | Tb | Dy | Fe | Co | dmin | dmax | dav | (°C.) | (°C.) |
| 4 | 22 | — | — | 72 | 6 | 15 | 248 | 98 | 1155 | 1100 |
| 5 | 22 | — | — | 72 | 6 | 8 | 97 | 51 | 1155 | 1100 |
| 6 | — | 26 | — | 68 | 6 | 25 | 297 | 101 | 1187 | 1140 |
| 7 | — | 26 | — | 68 | 6 | 44 | 697 | 186 | 1187 | 1140 |
| 8 | — | 13 | 12 | 68 | 7 | 15 | 147 | 78 | 1187 | 1140 |
| 9 | — | 13 | 12 | 68 | 7 | 0.6 | 25 | 8.3 | 1187 | 1100 |

TABLE 4

| | TARGET | | | | | | |
|---|---|---|---|---|---|---|---|
| | MICRO STRUCTURE GRAIN SIZE | | | DEFLECTIVE STRENGTH | OXYGEN CONTENT | DENSITY | SPECIFIC |
| No. | dmin | dmax | dav(μm) | (MPa) | (ppm) | (%) | PERMEABILITY |
| 4 | 18 | 226 | 103 | 94 | 470 | >99.5 | 3 |
| 5 | 9 | 91 | 56 | 78 | 890 | >99.5 | 2 |
| 6 | 28 | 269 | 121 | 86 | 430 | >99.5 | 2 |
| 7 | 53 | 658 | 268 | 65 | 380 | 99.3 | 3 |
| 8 | 20 | 129 | 84 | 109 | 518 | >99.5 | 2 |
| 9 | 2 | 23 | 15 | 73 | 990 | >99.5 | 2 |

For a microstructure observed by etching each of the resulting targets of the present invention, particulate micro structures and grain boundary phases between the alloy particles, similar to those observed in Example 1 and shown in FIG. 1, were also confirmed.

As seen from Tables 3 and 4, Sample No. 9 having the smaller volume mean size of the material powder and the smaller micro structure means size in the target micro structure than the other Samples tends to increase in the oxygen content and lower a little in the deflective strength.

Also, Sample No. 7 having the larger volume mean size of the material powder and the larger micro structure means size in the target micro structure than the other Samples has the small oxygen content, but tends to lower a little both in the deflective strength and the target density.

On the contrary, it is seen that Samples No. 4, 5, 6 and 8 meeting the range of the grain size d≦250 μm and the range of about 50≦$d_{ad}$≦120 μm of the micro structure mean size $d_{av}$ can provide the target having both high deflective strength and high mechanical strength.

Further, it is seen that the targets of all Samples have low specific permeability not more than 5 and hence are suitable for magnetron sputtering.

EXAMPLE 3

A rare earth-transition metal alloy ingot having a composition of, by atomic, 25% Tb, 70% Fe and 5% Co was produced by a vacuum high-frequency melting furnace. The charged weight was 12 kg, the vacuum degree was 6×10⁻³ Pd, and the ingot was cast in vacuum after the melting. The liquid phase occurring temperature of the cast ingot having the composition was determined as 1187° C. in a similar manner as in Example 1.

To study effects depending on types of the material powder, the cast ingot was put in an atomizer provided with a molten metal-dropping nozzle at the bottom of a crucible, and then pulverized by an argon gas atomization to obtain one type of material powder (hereinafter referred to as atomized powder).

Also, the similar material molten metal was dropped onto a rotating disk and then rapid cooled in a centrifugal manner to obtain another type of material powder (hereinafter referred to as centrifugally rapid cooled powder). Further, the ingot was comminuted by using a ball mill to obtain still another type of material powder (hereinafter referred to as comminuted powder).

The grain size of the material powder was adjusted for each type by screening such that the maximum grain size was 250 μm, the minimum grain size was 15 μm, and the mean grain size was 90 μm.

The material powder was sintered by the process of sintering and densifying by using an HIP at 1120° C. as with Example 1, or the process of using a hot press (HP) under vacuum of 10⁻³ Pa or less on condition of 20 MPa, 1120° C. and holding time of 2 hours, or the normal pressure sintering process of preliminarily compacting the powder at 300 MPa by using a CIP (cold isostatic press) and then heating a compact in a vacuum furnace under 10⁻³ Pa or less at 1120° C. for 2 hours.

Characteristics of the targets resulted from changing the manufacture method of the material powder and the sintering process thereof as mentioned above were evaluated in a similar manner as in Example 1. Evaluated results are shown in Table 5 below. Note that, under the foregoing conditions, particulate micro structures were confirmed to exist in the targets after etching.

TABLE 5

| MATERIAL | | TARGET | | | | | | |
|---|---|---|---|---|---|---|---|---|
| No. | POWDER MANUFAC- TURE METHOD | SINTER- ING PROCESS | MICRO STRUCTURE GRAIN SIZE (μm) | | | DEFLEC- TIVE STRENGTH (MPa) | OXYGEN AMOUNT (ppm) | DENSITY (%) | SPECIFIC PERMEA- BILITY |
| | | | dmin | dmax | dav | | | | |
| 10 | ATOMIZA- TION | HIP | 18 | 244 | 93 | 96 | 360 | >99.5 | 2 |
| 11 | ATOMIZA- TION | HP | 16 | 246 | 96 | 46 | 370 | 96 | 2 |
| 12 | CENTRIF- UGAL QUENCHING | HIP | 18 | 240 | 87 | 88 | 390 | >99.5 | 2 |
| 13 | CENTRIF- UGAL QUENCHING | NORMAL PRES- SURE | 18 | 238 | 86 | 7 | 1300 | 75 | 2 |
| 14 | COMMINU- TION | HIP | 16 | 244 | 95 | 52 | 2180 | >99.5 | 2 |
| 15 | COMMINU- TION | HP | 18 | 244 | 90 | 43 | 2270 | 94 | 2 |

As indicated by Samples Nos. 11 and 15 in Table 5, when sintering the material powder by the hot press (HP) at low pressure, the density could not be increased to a desired level under the foregoing conditions.

It is also seen that the normal pressure sintering process applied to Sample No. 13 is not preferable because the target of Sample No. 13 has lower density than when using the hot press process and its deflective strength is also remarkably small.

Further, for the manufacture method of the material powder, it is seen that the atomizing process and the centrifugal cooling process, i.e., the quenching solidification process, can reduce the content of oxygen in the target and hence are superior to the pulverizing process.

EMBODIMENT 4

As listed in Table 6, alloy powder and powder of Cr and Nb were prepared. The alloy powder was produced by the gas atomizing process in a similar manner as in Example 3. The grain size of the material alloy powder was adjusted by screening such that the maximum grain size was 250 μm, the minimum grain size was 15 μm, and the mean grain size was 90 μm.

The powder of Cr and Nb was commercially available powder having the grain size of 44 μm or below.

These types of powder were added in the simple or premixed powder form to the atomized powder to obtain the compositions shown in Table 6.

The prepared powder having each composition was enclosed in a capsule made of soft steel and then sintered by a hot hydrostatic press (HIP), thereby obtaining a target blank. The HIP conditions were 100 MPa, 2 hours, and 1120° C.

Resulting targets were evaluated in a similar manner as in Example 1. Evaluated results are shown in Table 7 below.

Note that, for a microstructure of each of the sintered targets, the presence of particulate micro structures was confirmed to exist and the grain sizes of the particulate micro structures were evaluated.

TABLE 6

| No. | FINAL POWDER COMPOSI- TION (ATOMIC %) | POWDER COMPOSITION |
|---|---|---|
| 16 | 24% Tb-69% Fe-4% Co-3% Cr | 24% Tb-69% Fe-4% Co-3% Cr powder |
| 17 | 24% Tb-69% Fe-4% Co-3% Cr | 24.7% Tb-71.1% Fe-4.1% Co powder + Cr powder |
| 18 | 25% Tb-69% Fe-5% Co-1% Nb | 25% Tb-69% Fe-5% Co-1% Nb powder |
| 19 | 25% Tb-69% Fe-5% Co-1% Nb | 25.3% Tb-69.7% Fe-5.0% Co powder + Nb powder |

TABLE 7

| | TARGET | | | | | | |
|---|---|---|---|---|---|---|---|
| No. | MICRO STRUC- TURE PARTICLE SIZE (μm) | | | DEFLEC- TIVE STRENGTH (MPa) | OXYGEN CON- TENT (ppm) | DEN- SITY (% | SPECIFIC PERMEA- BILITY |
| | dmin | dmax | dav | | | | |
| 16 | 18 | 244 | 93 | 96 | 350 | >99.5 | 2 |
| 17 | 20 | 241 | 91 | 93 | 360 | >99.5 | 2 |
| 18 | 21 | 236 | 93 | 95 | 350 | >99.5 | 2 |
| 19 | 21 | 235 | 94 | 96 | 350 | >99.5 | 2 |

As seen from Tables 6 and 7, even when Cr and Nb were added, the targets having not only high deflective strength not less than 70 MPa, but also low specific permeability not more than 5. Further, it was confirmed when Cr and Nb were added in the simple powder form, simple phases of Cr and Nb remained in the target micro structure.

Since the presence of hetero-phase in the target may impede uniformity in the progress of erosion during the period of sputtering, it is preferable that Cr and Nb had been previously added not in the simple form, but in the premixed alloy powder form.

As described above, according to the present invention, by producing the micro structure where the original form of the raw material powder remains, rather than the uniform micro structure, the deflective strength of the prealloy targets having low permeability can be increased remarkably. Therefore, the target of the present invention is able to have high mechanical strength and, at the same time, to produce the leakage magnetic flux on the target surface in sufficient density required for magnetron sputtering, by ensuring low permeability. As a result, it is possible to increase the efficiency in use of the target and prevent arcing discharge, etc. during the sputtering period.

Further, since the manufacture method of the present invention has succeeded in increasing the deflective strength and achieving high density of the target, it is expected to prevent both cracking during the working step and mixing of contaminants, further improve the efficiency in use of the target (i.e., prolong the target life), and avoid arcing electric discharge.

What is claimed is:

1. A target for a magneto-optical recording medium, having a target micro structure formed by sintering alloy powder composed essentially of intermetallic compound containing 15 to 30 atomic % of at least one rare earth metal and the balance of at least one transition metal so that original morphology of said alloy powder essentially remains.

2. A target for a magneto-optical recording medium, said target being a sintered body containing 15 to 30 atomic % of at least one rare earth metal and the balance of at least one transition metal, said target being provided with a microstructure in which traces of the particle surfaces of alloy raw material powder consisting essentially of intermetallic compound and having said composition remain.

3. A target for a magneto-optical recording medium, having particulate micro structures in which the original form of alloy powder consisting essentially of intermetallic compound and having a composition of 15 to 30 atomic % of at least one transition metal remains so that the particulate micro structures are interconnected through grain boundary phases to make a target micro structure, and deflective strength of said target being not less than 50 MPa.

4. A target for a magneto-optical recording medium according to claim 3, wherein, in a microstructure of said target, said particulate micro structures interconnected through the grain boundary phases among said intermetallic compound alloy powder particles have a substantial grain size not more than 350 μm.

5. A target for a magneto-optical recording medium according to any of claims 1 to 3, wherein the grain size said particulate micro structures is not more than 250 μm and the volume mean size $d_{av}$ of said particulate micro structures is in the range of $50 \leq d_{av} \leq 120$ μm.

6. A target for a magneto-optical recording medium according to any of claims 1 to 3, wherein the density of said target is not less than 99% in relative density.

7. A target for a magneto-optical recording medium according to any of claims 1 to 3, wherein the oxygen content of said target is not more than 1000 ppm.

8. A target for a magneto-optical recording medium according to any of claims 1 to 3, wherein the deflective strength of said target is not less than 70 MPa.

9. A manufacture method of a target for a magneto-optical recording medium, comprising the steps of producing alloy powder consisting essentially of intermetallic compound and having a target composition of 15 to 30 atomic % of at least one rare earth metal and the balance of at least one transition metal in advance, and then sintering said alloy powder at a temperature lower than the liquid phase occurring temperature of said target composition by 30° C. or more and under a high pressure not less than 90 MPa.

* * * * *